(12) United States Patent
Yang et al.

(10) Patent No.: US 7,393,230 B2
(45) Date of Patent: Jul. 1, 2008

(54) PRINTED CIRCUIT BOARD ASSEMBLY

(75) Inventors: Xiang-Qi Yang, Kunshan (CN); Xiao-Gao Yang, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/591,370

(22) Filed: Oct. 31, 2006

(65) Prior Publication Data
US 2007/0099470 A1    May 3, 2007

(30) Foreign Application Priority Data
Oct. 31, 2005    (CN)    .................. 2005 2 0076966

(51) Int. Cl.
*H01R 13/62* (2006.01)
(52) U.S. Cl. ........................................ 439/326
(58) Field of Classification Search ................ 439/326, 439/328, 74
See application file for complete search history.

(56) References Cited
U.S. PATENT DOCUMENTS

| | | | |
|---|---|---|---|
| 6,663,407 B1 * | 12/2003 | Pickles | 439/328 |
| 6,955,554 B2 * | 10/2005 | Korsunsky et al. | 439/328 |
| 7,021,953 B2 | 4/2006 | Kawamae | |
| 7,134,895 B1 * | 11/2006 | Choy et al. | 439/326 |
| 7,134,896 B1 * | 11/2006 | Chen | 439/326 |
| 7,182,618 B1 * | 2/2007 | Choy et al. | 439/328 |
| 2006/0160394 A1 * | 7/2006 | Korsunsky et al. | 439/326 |

FOREIGN PATENT DOCUMENTS

TW    545747    8/2003

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

A latching mechanism (4) for use with an electrical connector to hold an electronic card on a printed circuit board, the latching mechanism (4) includes at least one supporting portion (41) for resting the electronic card thereon, fixing portions (46) which are fastened to said printed circuit board, and latches (47) extending from said at least one supporting portion (41), with a contact end portion of said card being received in said card edge connector, which latch an opposite end portion of said electronic card in a state where said card is substantially parallel to said printed circuit board. Said latch (47) comprising spring arms (44) which are approximately parallel to said printed circuit board.

1 Claim, 7 Drawing Sheets

PRINTED CIRCUIT BOARD ASSEMBLY

BACKGROUND

1. Field of the Invention

The invention relates to an electrical assembly, and particularly to a printed circuit board assembly having an electronic card electrically and mechanically connected to a mother board via an electrical connector and a latching mechanism in a parallel manner.

2. The Related Art

Taiwan patent number 545747 discloses a kind of latching mechanism for use with a card edge connector. A electronic card includes a distal end which is inserted to said card edge connector and a opposite distal end which is locked by said latching mechanism. The mechanism is made from insulative material including a supporting portion and a latching portion, which upwardly extends from the supporting portion, wherein the latching portion includes a elastic arm extending from the supporting portion. Because the elastic arm is so short which is approximate equal to the thickness of the card, thus resulting in limited elasticity of the elastic arm. As a result, the latching portion has less moveability and less effective latching area with regard to the opposite distal end of the card. It is possible for the card to be withdrawn from the latching mechanism in vibration. On the other hand, the latching mechanism cannot be assembled to a printed circuit board using conventional pick and place equipment because there is not any portion for picking.

U.S. Pat. No. 7,021,953 discloses latching mechanism for use with a card edge connector, wherein the latching mechanism defines a latching portion at a distal end of a spring arm, a support portion and a positioning post, which extends from the support portion. This design allows the better guiding function of the positioning post and the electronic card does not tend to be withdrawn from the latching portion. Anyhow, the latching mechanism is made from a single metal piece in forming which results in complicated structure and the uncontrollable dimension and position precision. Understandably, this design has difficulties in manufacturing. On the other hand, the metallic latching mechanism disadvantageously tends to result in shorting if the neighboring component is densely arranged therearound Therefore, it is desired to have an improved latching mechanism for use with the card edge connector.

SUMMARY OF THE INVENTION

Accordingly, an object of the present invention is to provide a latching mechanism which allows a relatively large engagement area on a card for assuring reliable latching function.

To achieve the above-mentioned object, a latching mechanism is provided for use with an electrical connector to hold an electronic card on a printed circuit board. The latching mechanism comprises at least one supporting portion for resting the electronic card thereon; fixing portions which are fastened to said printed circuit board; and latches extending from said at least one supporting portion, with a contact end portion of said card being received in said card edge connector, which latch an opposite end portion of said electronic card in a state where said card is substantially parallel to said printed circuit board; wherein said latch comprising spring arms which are approximately parallel to said printed circuit board.

Other objects, advantages and novel features of the present invention will become more apparent from the following detailed description of the present embodiment when taken in conjunction with the accompanying drawings.

DETAILED DESCRIPTION OF THE PREFERRED EMBODIMENT

Figure 1:
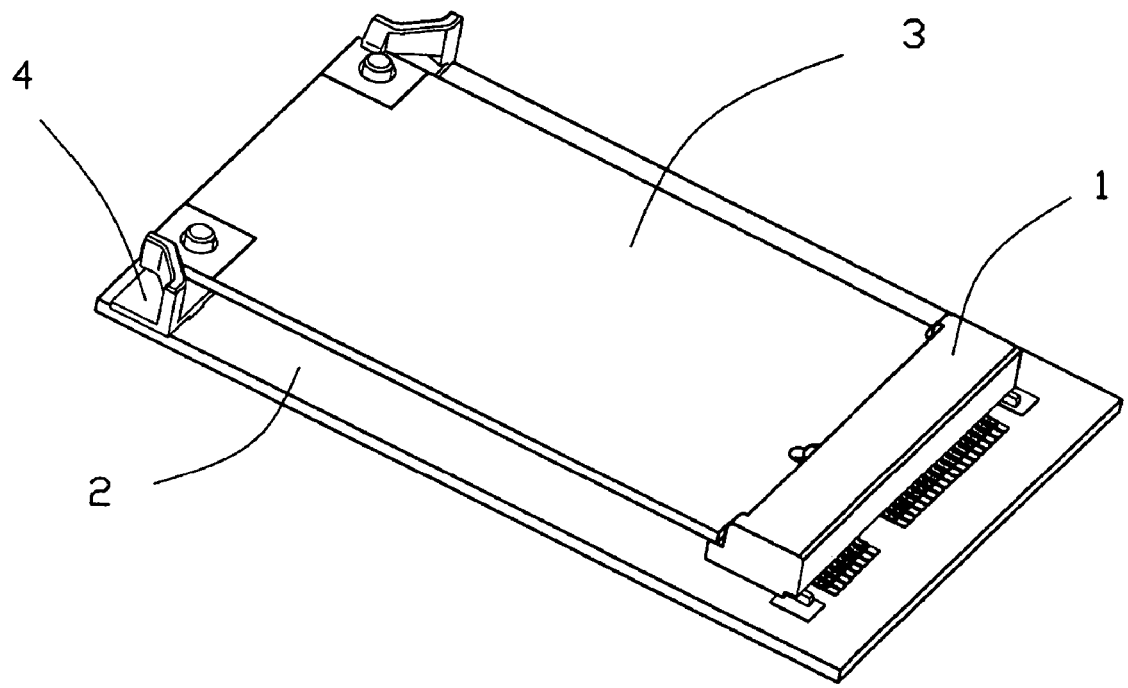
FIG. 1 is a perspective view of the latching mechanism of an exemplary embodiment of the present invention and the corresponding card edge connector both mounted upon a printed circuit board, and the corresponding electronic card thereof.

References will now be made to the drawing figures to describe the preferred embodiment of the present invention in detail.

Figure 2:
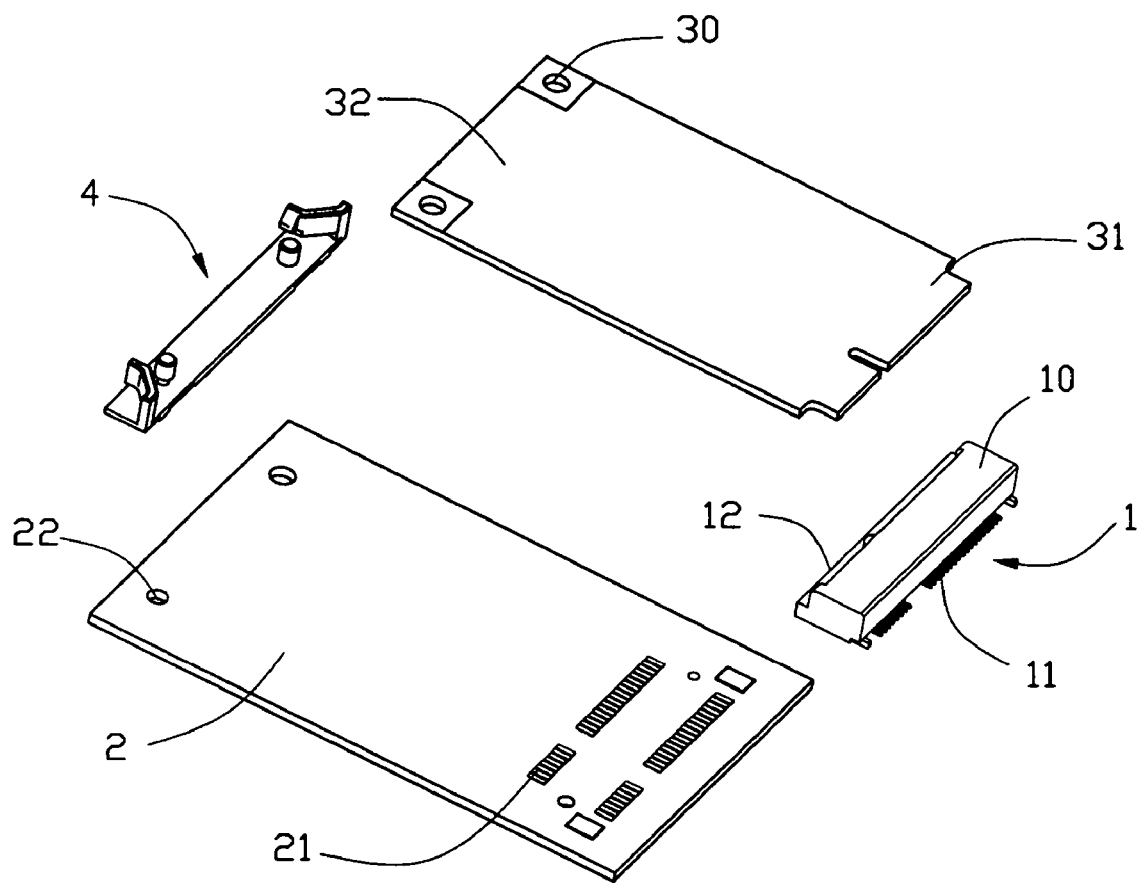
FIG. 2 is an exploded perspective view of the latching mechanism and the corresponding card edge connector above the printed circuit board.

It will be noted here that for a better understanding, most of like components are designated by like reference numerals throughout the various figures in the embodiments. Referring to FIGS. 1-2, a latching mechanism 4 and a card edge connector 1 are commonly mounted to a printed circuit board 2 for holding an electronic card 3 on the printed circuit board 2.

One end of the printed circuit board 2 includes a plurality of conductive pads 21, and the other end thereof defines a pair of through holes 22. The front end 31 of the electronic card 3 includes a plurality of conductors (not shown), and the rear end 32 thereof defines a pair of positioning holes 30. The card edge connector 1 includes an insulative housing 10 and a plurality of conductive contacts 11 therein. The insulative housing 10 defines a card receiving slot 12. One end of the contact 11 is positioned in the slot 12, and the other end thereof is mechanically and electrically connected to the corresponding conductive pad 21. The front end 31 of the electronic card 3 is inserted into the slot 12 to have the conductors mechanically and electrically connected to the end of the corresponding contact 11 so as to form an electrical connection between the electronic card 3 and the printed circuit board 2.

Figure 3:
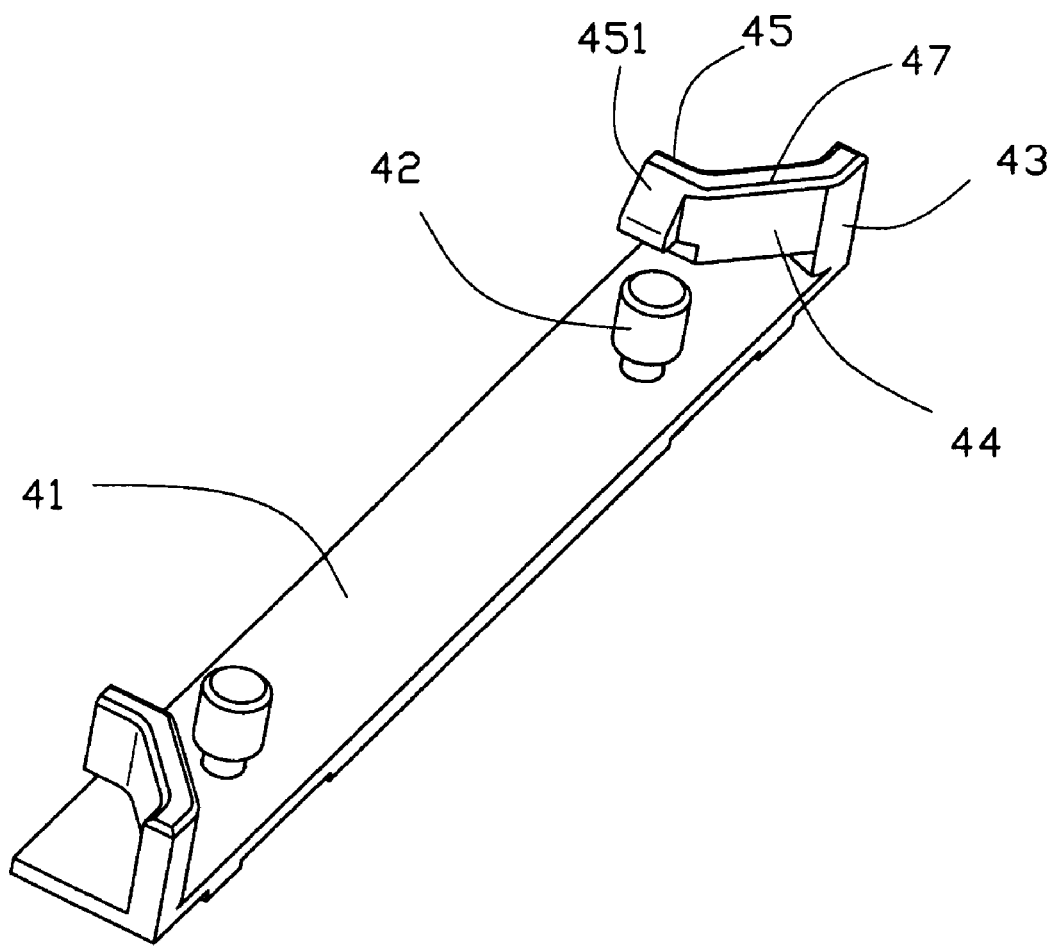
FIG. 3 is an enlarged perspective view of the latching mechanism.
Figure 4:
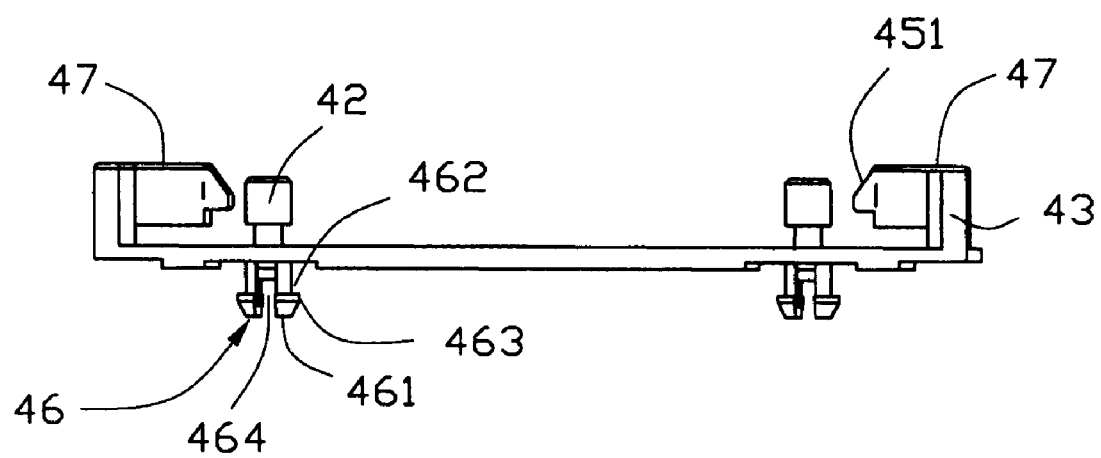
FIG. 4 is a front elevational view of the latching mechanism of FIG. 3.
Figure 5:
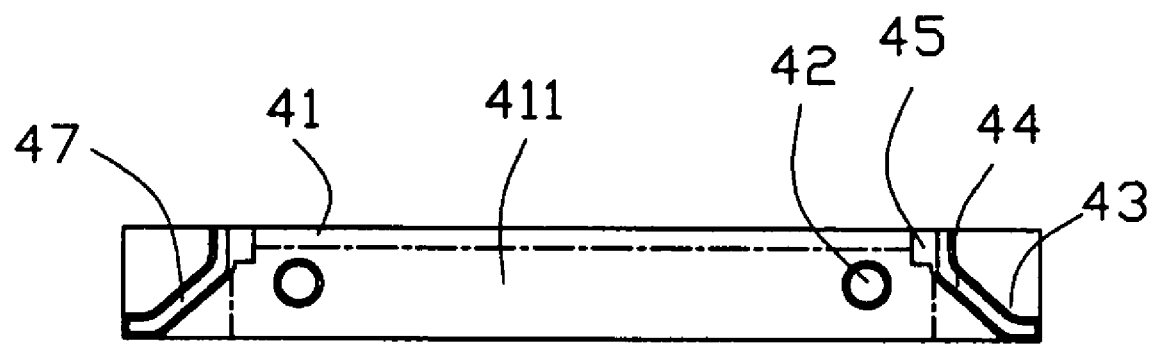
FIG. 5 is a top elevational view of the latching mechanism of FIG. 3.

Referring to FIGS. 3-5, the latching mechanism 4 is made from the insulative material and defines latches 47 and an supporting portion 41, and said supporting portion is a elongated flat part. The latches 47 include a pair of connecting portion 43 extending upwardly from the opposite right and left ends of the elongated supporting portion 41, and a pair of positioning posts 42 extending upwardly from the elongated supporting portion 41 around said connecting portion 43 for coupling to the positioning hole 30 of the electronic card 3. A spring arm 44 extends from the up end of the connecting portion 43 toward the side of the positioning post 42 and away the card edge connector 1 in an oblique manner, which is parallel to the elongated supporting portion 41. A latching portion 45 is located at the free distal end of the spring arm 44 and extends toward the positioning posts 42, with an oblique upward guiding face 451 thereon. A pair of fixing portion 46 extends downwardly from the bottom portion of the elongated supporting portion 41 and away the positioning post 42. Each fixing portion 46 includes a pair of fixing pieces 461 which form a groove 464 therebetween, wherein the fixing piece 461 includes a connecting piece 462 connecting to the elongated supporting portion 41 and a fixing head 463 located at the distal thereof.

The latching mechanism 4 is fastened to the printed circuit board 2 by means of the fixing portions 46 extending through the through holes 22 and the fixing head 461 clasping the printed circuit board 2. During assembling, the front edge of the electronic card 3 is inserted initially into the slot 12 of the card edge connector, and rear edge of the electronic card 3 is successively downwardly moved toward the passing the latching portion 45, wherein the spring arms 44 are sidewardly deflected. At the same time, the electronic card 3 is correctly positioned relative to the printed circuit board 2 via the positioning posts 42 extending through the positioning holes 30 in a stable downward movement. When the rear edge of the electronic card 3 completely passes the latching portion 45, the spring arms 44 resume the original position to have the latching portion 45 downwardly press the rear edge of the electronic card 3. Under this condition, the electronic card 3 can not further downwardly moved because of the supporting portion 41, and further horizontally moved by means of the positioning posts 42 extending through the positioning holes 30. During disassembling, the guiding face 451 are moved sidewardly to have the corresponding spring arms 44 and latching portion 45 moved sidewardly associatively, and the card 3 is disengaged from the latching portion 45.

Referring to FIG. 5, there is a supporting area 411 in which the electronic card 3 rests on and which is formed on the supporting portion 41 in a state in which the electronic card 3 is substantially parallel to the printed circuit board 2 and latched by the latches 47. As shown, the connecting portions 43 are located on the supporting portion 41 and adjacent to the supporting area 411, and the spring arm 44 extends toward the supporting area 411 in an oblique manner, while the latching portions 45 are located at a level higher than the supporting area 411 by a distance. During assembling, the rear edge of the electronic card 3 touches the guiding face 451 and is successively downwardly moved toward the passing the latching portion 45 wherein the spring arms 44 are deflected away the supporting area 411. During disassembling, the latching portions 45 are moved away the supporting area 411.

The spring arms 44 are extended from the connecting portion 43 toward the supporting area 411 in an oblique manner, so that the length of the spring arms 44 can be designed and manufactured for meeting the elasticity thereof, thus allowing a relatively large engagement area between the card 3 and the latching portion 54 for assuring reliable latching function. Understandably, the supporting portion 41 may server as a suction part for suction assembling the latching mechanism 4 to the printed circuit board 2. On the other hand, the latching mechanism 4 is integrally formed by insulative material, and structure thereof is sample, thus being easy to manufacture. Moreover, the insulative latching mechanism 4 reduces risks of shorting if the neighboring components is densely arranged therearound.

Figure 6:
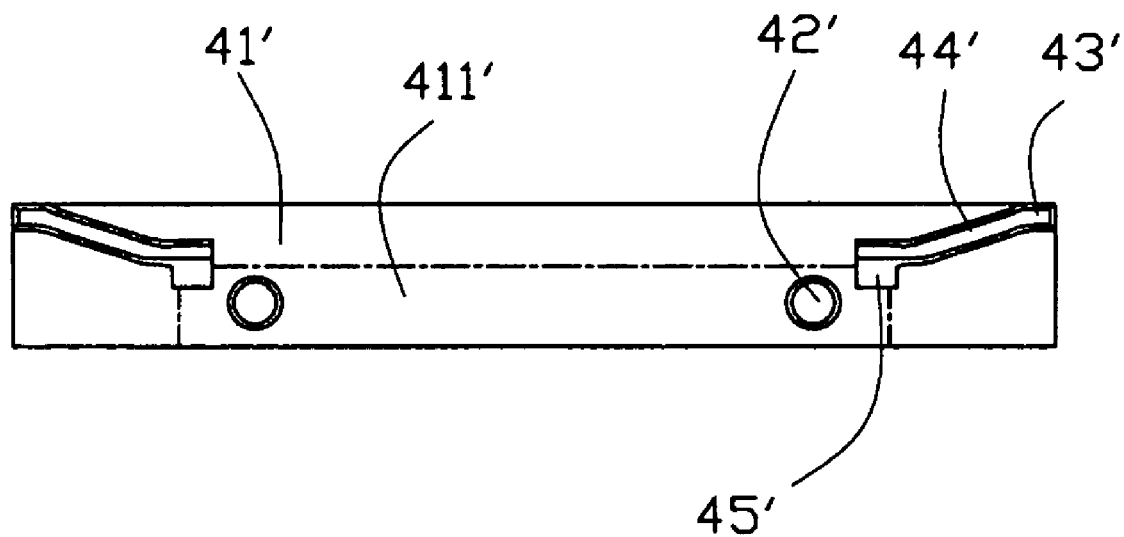
FIG. 6 is a top elevational view of the latching mechanism of a second embodiment of the present invention.
Figure 7:
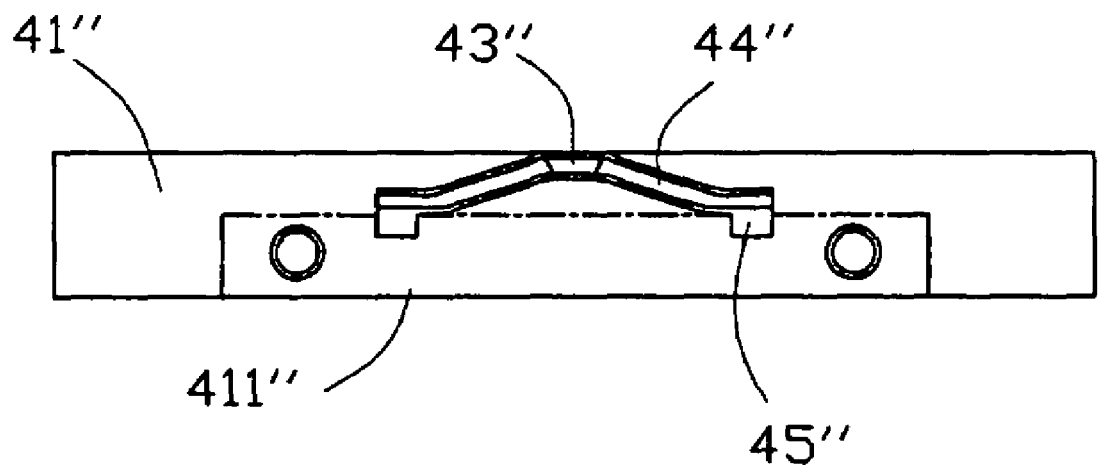
FIG. 7 is a top elevational view of the latching mechanism of a third embodiment of the present invention.

Referring to FIGS. 6-7, the connecting portions 43' and 43" are located to different portion of the flat portions 41' and 41", and the spring arm 44' and 44" are extend from the up end of the connecting portion toward the supporting area 411' and 411", and the latching portions 45' and 45" are located at a level higher than the latching area by a distance.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, person of ordinary skill in this field are to understand that all such equivalent structures are to be included within the scope of the following claims.

We claim:

1. An electrical connector assembly comprising:
   a printed circuit board;
   a card edge connector located at a first region of the printed circuit board;
   an electronic card having thereof one end received in the card edge connector;
   a latching mechanism located at a second region of the printed circuit board spaced from the first region;
   said latching mechanism being integrally formed by insulative material and including:
   at least one supporting portion for resting the electronic card thereon; and
   latches extending from said at least one supporting portion and latching an opposite end portion of said electronic card in a state where said card is substantially parallel to said printed circuit board; wherein
   said latches comprising spring arms which are approximately parallel to said printed circuit board;
   wherein the spring arm is deflected about a fulcrum axis which extends vertically and transversely located on an outer side of the card.

* * * * *